United States Patent [19]

Chen

[11] Patent Number: 4,703,281

[45] Date of Patent: Oct. 27, 1987

[54] CLOCKING PULSE GENERATOR

[75] Inventor: Wen T. Chen, West Newton, Mass.

[73] Assignee: GTE Laboratories Incorporated, Waltham, Mass.

[21] Appl. No.: 225,178

[22] Filed: Jan. 15, 1981

[51] Int. Cl.[4] .................. H03K 5/08; H03K 17/40; G06G 7/12

[52] U.S. Cl. .................. 328/28; 307/260; 307/494; 307/269; 328/104

[58] Field of Search .............. 307/260, 263, 490, 494, 307/262, 299, 479, 269, 243; 328/142–143, 26, 28, 32, 104

[56] References Cited

U.S. PATENT DOCUMENTS

| | | | |
|---|---|---|---|
| 3,212,012 | 10/1965 | Schwarz | 307/262 |
| 3,936,759 | 2/1976 | Macheel | 307/491 |
| 4,030,030 | 6/1977 | Fahlgren | 307/494 |
| 4,307,305 | 12/1981 | Morris | 307/491 |

Primary Examiner—Stanley D. Miller
Assistant Examiner—B. P. Davis
Attorney, Agent, or Firm—Fred Fisher

[57] ABSTRACT

A clocking pulse generator includes means for receiving voltage from a multi-phase alternating current electrical power source. A vector summing circuit provides a non-zero resultant vector for various combinations of multi-phase operating conditions. A multi-phase voltage dividing circuit couples the receiving means to the vector summing circuit. The non-zero resultant vector is converted into a halfwave rectified signal and applied to a first input of a comparator. The second input of the comparator is coupled to receive a preset threshold voltage. The comparator generates an output which provide clocking pulses therefrom.

5 Claims, 3 Drawing Figures

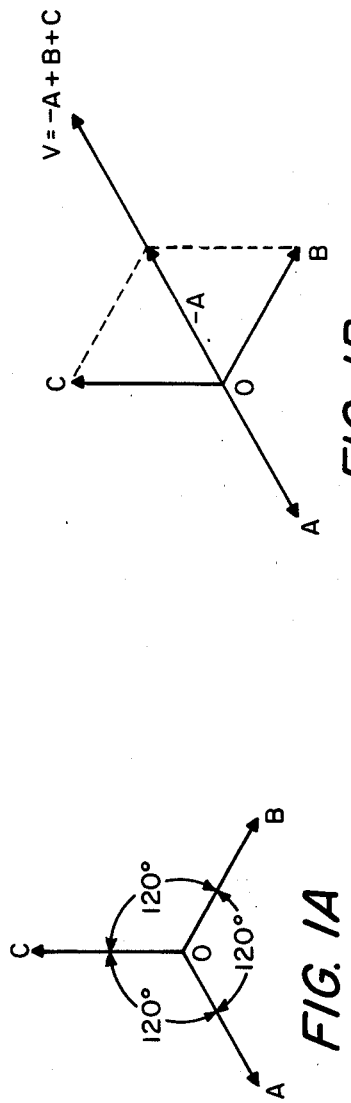
FIG. 1B
FIG. 1A
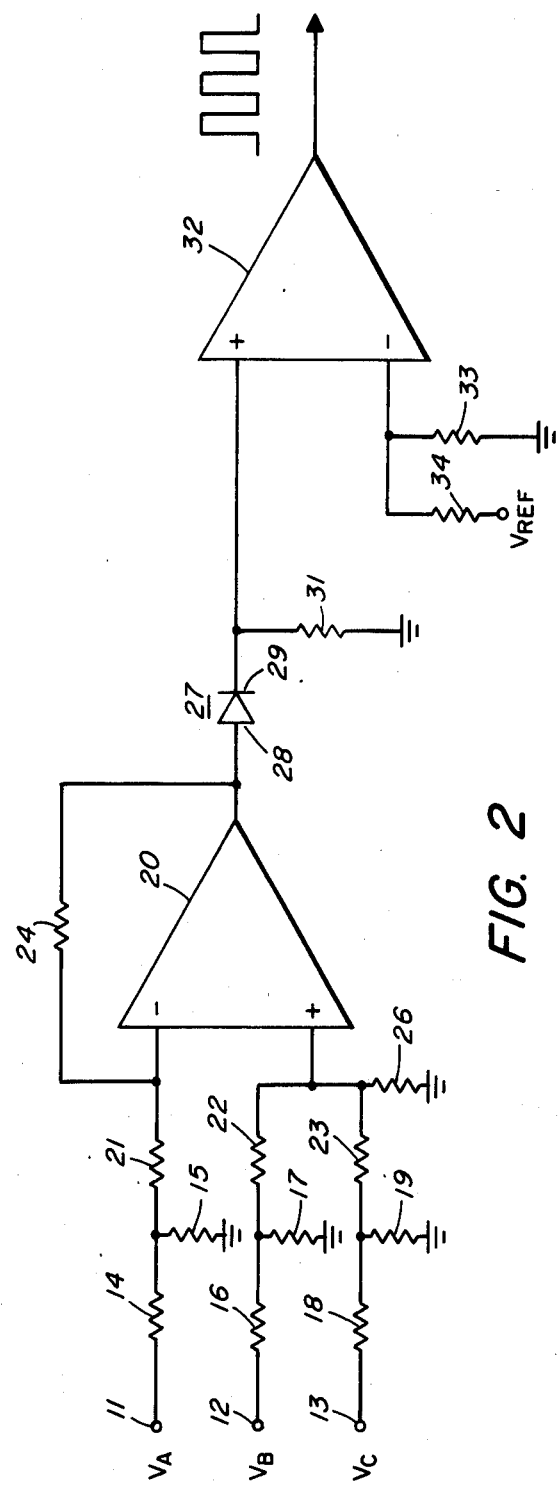
FIG. 2

CLOCKING PULSE GENERATOR

BACKGROUND OF THE INVENTION

1. Field of the Invention

This invention relates to clocking pulse generators. Accordingly, it is a general object of this invention to provide new and improved generators of such character.

2. Description of the Prior Art

A major purpose of this invention is to provide for a reliable clocking signal for digital applications and for timing applications in an alternating current operating system; for example, the three-phase alternating current sources in commercial and industrial applications or the 110 V alternating current lines in the residential area application. The invention is directed to apparatus for generating a digital clocking pulse directly from a three-phase alternating current electrical power source as well as from a single-phase alternating current line. In a three-phase alternating current electrical power application, the invention is directed to function whenever any single phase among the three phases, any two phases of the three phases, or all three phases of the circuits are energized.

Well known old apparatus for providing clocking pulse generation utilize either crystal controlled oscillators, voltage controlled oscillators, voltage to frequency converters, multivibrators, or timing circuits. Disadvantageously, such prior art circuits require many components including both active devices and passive components. They are expensive; they require well regulated power supplies and/or good temperature compensation.

SUMMARY OF THE INVENTION

Another object of this invention is to provide a new and improved clocking pulse generator which is highly reliable with excellent frequency stability.

Still another object of this invention is to provide for a new and improved clocking pulse generator which requires no temperature compensation so as to minimize any drift due to temperature variations.

Still yet another object of this invention is to provide for a new and improved clocking pulse generator that is cost effective in that only two operational amplifiers with a minimum number of passive components are utilized.

Yet still another object of this invention is to provide for a new and improved electronic clocking pulse generator, applicable for use in a single-phase alternating current line as well as in a three-phase alternating current source.

In accordance with a preferred embodiment of the invention, a clocking pulse generator includes means for receiving voltage from an alternating current electrical power source. A vector summing circuit is coupled to the receiving means for providing a non-zero resultant vector for various conditions of voltage applied to the means. A voltage comparator is coupled to receive the non-zero resultant vector for providing clocking pulses therefrom.

In accordance with another embodiment of the invention, a clocking pulse generator includes means for receiving voltage from a multi-phase alternating current electrical power source. A vector summing circuit, coupled to the receiving means for providing a non-zero resultant vector for any possible combination of multiphase operating conditions, is provided and is coupled to a voltage comparator which provides clocking pulses therefrom.

In accordance with a specific embodiment of the invention, a clocking pulse generator includes means for receiving voltage from a multi-phase alternating current electrical power source. A vector summing circuit provides a non-zero resultant vector for various combinations of the multi-phase operating conditions. A multiphase voltage dividing circuit couples the receiving means to the vector summing circuit. The non-zero resultant vector is converted into a half-wave rectified signal and is applied to one input of a comparator. The other input of the comparator is coupled to receive a preset threshold voltage. The comparator provides clocking pulses therefrom. In accordance with certain features of the invention, the comparator can include an operational amplifier, and the voltage dividing circuit can include a plurality of transformers.

BRIEF DESCRIPTION OF THE DRAWINGS

Other objects, advantages and features of this invention, together with its construction and mode of operation, will become more apparent from the following description, when read in conjunction with the accompanying drawings, in which:

FIG. 1A is a vector diagram of a balanced three-phase alternating current electrical power source;

FIG. 1B shows a non-zero resultant vector derived from the vector sum of an inverted vector (−A) and the other vectors (B & C); and FIG. 2 is a circuit diagram of a preferred embodiment of the invention, illustrating a clocking system generated from a three-phase alternating current source.

DESCRIPTION OF PREFERRED EMBODIMENTS

Referring to FIG. 1A, there is shown a vector diagram of a three-phase alternating current source. This source can be either a voltage source or a current source. Vectors A, B and C each represent an individual source vector for the phase A, B and C, respectively. The vector sum of the three vectors is zero for a balanced three-phased system.

When one of the three vectors is inverted, for example, the vector A, and the vector summation is made, the resultant vector is a non-zero vector as shown in FIG. 1B.

Based upon the foregoing principle, a vector summing circuit which yields a non-zero vector, can be fed to a voltage comparator to produce a digital clocking pulse, as shown in FIG. 2.

A three-phase alternating current source can be applied, respectively, to terminals 11, 12 and 13. The terminal 11 is coupled through serially connected resistors 14, 15 to a point of reference potential, such as ground. Likewise, the terminal 12 is coupled through serially connected resistors 16, 17 to a point of reference potential, such as ground; and the terminal 13 is coupled through serially connected resistors 18, 19 to a point of reference potential, such as ground. The resistive elements 14 and 15; 16 and 17; and 18 and 19 form a three-phase voltage dividing network. The resistance ratio of the resistance 14 to the resistance 15 (likewise, the resistance 16 to the resistance 17 and the resistance 18 to the resistance 19) is chosen so that the voltage dividing network provides a suitable electric potential at the junctions of the resistors 14 and 15, 16 and 17, and 18 and 19, respectively.

The junction of the resistors 14 and 15 is coupled by way of a resistor 21 to the negative terminal of an operational amplifier 20. The junction of the resistors 16 and 17 is coupled by way of the resistor 22 to the positive terminal of the operational amplifier 20, and the common junction of the resistors 18 and 19 is coupled by way of a resistor 23 to the positive terminal of the operational amplifier 20. The output of the operational amplifier 20 is coupled back to the negative input terminal thereof by way of a resistor 24. The positive terminal of the operational amplifier 20 is coupled to a point of reference potential, such as ground, via a resistor 26.

The ratio of the values of the resistance 24 to the resistance 21 governs the weighting factor of the phase signal at the junction of the resistors 14 and 15. Similarly, the ratios of the values of the resistance 26 to the resistance 22 and the values of the resistance 26 to the resistance 23, governs the weighting factors of the corresponding phase signals. These weighting factors are determined in such a way that the vector summing circuit 20 has an appropriate amplification to yield a non-zero resultant vector at its output terminal.

A diode 27 has its anode 28 coupled to the output terminal of the operational amplifier 20. The cathode 29 of the diode 27 is coupled through a resistor 31 to a point of reference potential, such as ground. The cathode 29 is also coupled to the positive terminal of a comparator 32. The comparator 32 can take the form of an operational amplifier. The negative terminal of the comparator 32 is coupled through a resistor 33 to a point of reference potential, such as ground, and is also coupled through a resistor 34 to a voltage reference source.

The diode 27 and the resistor 31 convert the alternating signal from the operational amplifier 20 into a half-wave rectified signal at the cathode 29 for a single supply operated comparator 32. In a dual supply operating comparator, the diode 27 and the resistor 31 can be eliminated, and the output signal from the operational amplifier 20 can be fed directly to the non-inverted input terminal of the comparator 32. The resistive network of the resistor 34 and the resistor 33, including the voltage reference source, provides a desired threshold voltage at the negative terminal of the comparator 32. When the incoming signal voltage at the positive terminal of the comparator 32 is greater than the preset threshold value, the output terminal of the comparator 32 stays at a high state. When the incoming signal voltage at the positive terminal of the comparator 32 is lower than the preset threshold value, the comparator 32 switches into a low state, and thus a square wave pulse is generated as shown in FIG. 2. The frequency of the square pulses is determined by the driving source. It is 60 Hz, in the example given here, wherein the signal applied to the terminals 11, 12, and 13 is also 60 Hz. The duty factor (the ratio of the period of the high state to that of the low state) is adjustable by the variance of the preset threshold value.

An operational amplifier, operating at an open loop gain, can be wired to perform a function of voltage comparison. Similar to the function described hereinabove, when the incoming signal voltage applied to the positive terminal of the comparator 32 is higher than the preset threshold value, the operational amplifier is driven into the saturated state and stays at the high state. When the incoming signal voltage at the positive terminal of the comparator 32 is lower than the preset threshold value, the operational amplifier is driven into the other extreme and stays at the low state. Therefore, a periodic pulse train is generated.

The voltage dividing network can be based upon a plurality of resistors as is commonly used in the field. The voltage dividing network can also take the form of a magnetic coupling, such as by way of transformers and toroids, in which case the number of turns on the primary coil and that of the secondary coil can be governed by the voltage available at the driving source and by the desired signal voltages at the terminals 11, 12 and 13 of FIG. 2.

With a single-phase 110 volt ac line application, only one operational amplifier or comparator with a signal coupler is necessary.

In view of the foregoing, it is shown that the advantages of this invention include that it is cost effective in that only two operational amplifiers with a minimum number of passive components are involved. It is very reliable with excellent frequency stability, and there is no temperature compensation required to minimize the drift due to temperature variations.

The foregoing circuit works well in a single-phase ac line as well as in a three-phase ac source. It is especially useful in a three-phase industrial circuit breaker application, and also in a motor delayed time control application.

What is claimed is:

1. A clocking pulse generator comprising
means for receiving voltage from an alternating current electrical power source;
a vector summing circuit coupled to said receiving means for providing a non-zero resultant vector for various conditions of voltage applied to said means; and
a voltage comparator, coupled to receive said non-zero resultant vector, for providing clocking pulses therefrom.

2. A clocking pulse generator comprising
means for receiving voltage from a multi-phase alternating current electrical power source;
a vector summing circuit, coupled to said receiving means, for providing a non-zero resultant vector for any possible combination of multi-phase operating conditions; and
a voltage comparator, coupled to receive said non-zero resultant vector, for providing clocking pulses therefrom.

3. A clocking pulse generator comprising
means for receiving voltage from a multi-phase alternating current electrical power source;
a vector summing circuit for providing a non-zero resultant vector for various combinations of multi-phase operating conditions;
a multi-phase voltage dividing circuit for coupling said receiving means to said vector summing circuit; means for converting said non-zero resultant vector into a half-wave rectified signal;
means for providing a preset threshold voltage; and
a comparator having a first input coupled to receive said half-wave rectified signal, a second input coupled to receive said preset threshold voltage, and an output for providing clocking pulses therefrom.

4. The generator as recited in claim 3 wherein said comparator comprises an operational amplifier.

5. The generator as recited in claim 3 wherein said voltage dividing circuit comprises a plurality of transformers.

* * * * *